United States Patent
Ding et al.

(10) Patent No.: US 9,429,625 B1
(45) Date of Patent: Aug. 30, 2016

(54) ANALOG SIGNAL TEST CIRCUITS AND METHODS

(75) Inventors: Weiqi Ding, Fremont, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 959 days.

(21) Appl. No.: 13/475,256

(22) Filed: May 18, 2012

(51) Int. Cl.
*G01R 31/00* (2006.01)
*G01R 31/319* (2006.01)
*G01R 31/40* (2014.01)

(52) U.S. Cl.
CPC ......... *G01R 31/31924* (2013.01); *G01R 31/40* (2013.01)

(58) Field of Classification Search
CPC .......... G01R 31/3167; G01R 31/2834; H01L 2924/0002; H01L 2924/00
USPC ............................... 324/750.3, 762.01–762.1; 714/724–745; 702/85, 107
See application file for complete search history.

(56) References Cited

U.S. PATENT DOCUMENTS

| | | | | |
|---|---|---|---|---|
| 5,289,116 A * | 2/1994 | Kurita et al. | | 324/76.11 |
| 5,414,365 A * | 5/1995 | Coggins et al. | | 324/607 |
| 5,659,312 A * | 8/1997 | Sunter et al. | | 341/120 |
| 6,275,422 B1 * | 8/2001 | Javanifard et al. | | 365/189.07 |
| 6,466,053 B2 * | 10/2002 | Duesman | | 326/47 |
| 6,507,215 B1 * | 1/2003 | Piasecki et al. | .... | G06F 13/4072 326/37 |
| 6,509,758 B2 * | 1/2003 | Piasecki et al. | | 326/37 |
| 6,512,989 B1 * | 1/2003 | Deome et al. | | 702/124 |
| 6,788,237 B1 * | 9/2004 | Bidermann et al. | .. | H03M 1/123 341/155 |
| 7,102,555 B2 * | 9/2006 | Collins et al. | | 341/120 |
| 7,129,734 B2 * | 10/2006 | Geiger et al. | | 324/750.3 |
| 7,138,820 B2 * | 11/2006 | Goetting et al. | | 326/9 |
| 7,262,621 B1 | 8/2007 | Caffee et al. | | |
| 7,284,173 B2 * | 10/2007 | Napolitano | | 714/726 |
| 7,411,538 B1 * | 8/2008 | Piasecki | | 341/161 |
| 7,587,647 B2 * | 9/2009 | Olleta et al. | | 714/740 |
| 7,599,299 B2 * | 10/2009 | Goetting et al. | | 370/241 |
| 7,673,198 B1 * | 3/2010 | Tu et al. | | 714/724 |
| 7,847,572 B2 * | 12/2010 | Watanabe et al. | | 324/750.3 |
| 8,125,360 B1 * | 2/2012 | Kutz et al. | | 341/120 |
| 2002/0153923 A1 * | 10/2002 | Piasecki | | G06J 1/00 326/57 |
| 2003/0154047 A1 * | 8/2003 | Chun et al. | | 702/118 |
| 2005/0204224 A1 * | 9/2005 | Piasecki | ............. | G06F 13/4072 714/724 |
| 2005/0242980 A1 * | 11/2005 | Collins | .......... | G01R 31/318555 341/155 |
| 2007/0268037 A1 * | 11/2007 | Teng et al. | | 324/765 |
| 2010/0109674 A1 * | 5/2010 | Kuramochi et al. | | 324/537 |
| 2013/0022136 A1 * | 1/2013 | Collins | ............ | H03K 19/17744 375/259 |

* cited by examiner

*Primary Examiner* — Huy Q Phan
*Assistant Examiner* — Raul Rios Russo
(74) *Attorney, Agent, or Firm* — Steven J. Cahill

(57) ABSTRACT

An analog test network includes a conductor. The conductor is coupled to provide a first analog signal from a circuit under test to an analog-to-digital converter circuit. The analog-to-digital converter circuit is operable to generate a first digital signal based on the first analog signal. A control circuit is operable to generate a second digital signal based on the first digital signal. A digital-to-analog converter circuit is operable to generate a second analog signal based on the second digital signal. The conductor is coupled to provide the second analog signal from the digital-to-analog converter circuit to the circuit under test.

20 Claims, 5 Drawing Sheets

ANALOG SIGNAL TEST CIRCUITS AND METHODS

FIELD OF THE DISCLOSURE

The present disclosure relates to electronic circuits, and more particularly, to analog signal test circuits and methods.

BACKGROUND

Many types of integrated circuits have internal circuit blocks that generate analog signals. Information about analog signals generated by internal circuit blocks of an integrated circuit can be used for debugging and production testing. Some of the nodes of internal circuit blocks of an integrated circuit can be forced to specific voltages for testing and debugging purposes.

An integrated circuit may have an analog test bus that is used to test internal analog signals. An analog signal is provided from an internal circuit block in the integrated circuit through an analog test bus to external measurement equipment that is used to measure the analog signal. However, this measurement technique has limited accuracy, limited bandwidth, and typically requires a long test time.

BRIEF SUMMARY

According to some embodiments, an analog test network includes a conductor. The conductor is coupled to provide a first analog signal from a circuit under test to an analog-to-digital converter circuit. The analog-to-digital converter circuit is operable to generate a first digital signal based on the first analog signal. A control circuit is operable to generate a second digital signal based on the first digital signal. A digital-to-analog converter circuit is operable to generate a second analog signal based on the second digital signal. The conductor is coupled to provide the second analog signal from the digital-to-analog converter circuit to the circuit under test.

According to other embodiments, an analog test network is operable to provide a first analog signal from a circuit under test to an analog-to-digital converter circuit. The analog-to-digital converter circuit is operable to generate a digital signal based on the first analog signal. A control circuit is operable to generate a second analog signal based on the digital signal. A conductor is coupled to provide the second analog signal from an output of the control circuit directly to an input of the circuit under test.

Various objects, features, and advantages of the present invention will become apparent upon consideration of the following detailed description and the accompanying drawings.

DETAILED DESCRIPTION

Figure 1:
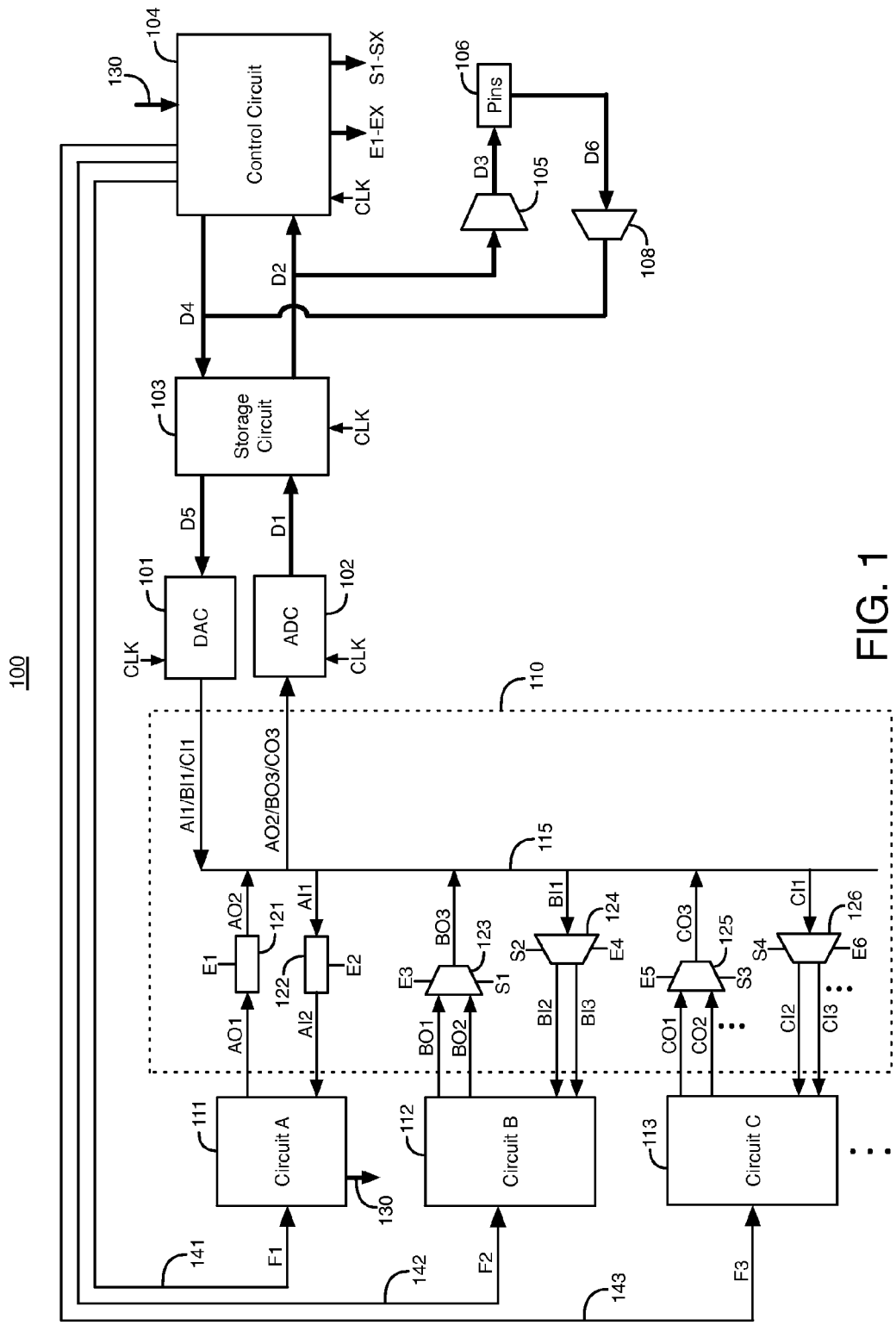
FIG. 1 illustrates an example of an analog test system on an integrated circuit, according to an embodiment of the present invention.

FIG. 1 illustrates an example of an analog test system 100 on an integrated circuit, according to an embodiment of the present invention. Analog test system 100 includes digital-to-analog converter (DAC) circuit 101, analog-to-digital converter (ADC) circuit 102, storage circuit 103, control circuit 104, digital multiplexer circuits 105 and 108, pins 106, analog test network 110, circuits under test 111-113, digital bus 130, and conductors 141-143. Analog test network 110 includes conductor 115, pass gate circuits 121-122, analog multiplexer circuits 123 and 125, and analog demultiplexer circuits 124 and 126. Analog test system 100 may be in any type of integrated circuit die, such as, a field programmable gate array or an application specific integrated circuit.

Analog test system 100 can test analog signals generated by circuits in the integrated circuit. For example, analog test system 100 can test analog signals generated by circuit A 111, circuit B 112, and circuit C 113. Analog test system 100 can provide an analog signal from one of circuits 111, 112, or 113 to analog test network 110 for testing. Circuits 111, 112, and 113 are circuits under test in analog test system 100. Analog test system 100 can also provide an analog signal from other circuits under test (not shown) to analog test network 100 for testing.

Circuits 111-113 can be any type of circuit blocks that generate analog signals. For example, one or more of circuits 111-113 may be a voltage-controlled oscillator circuit, a current-controlled oscillator circuit, a power supply circuit, an on-chip termination circuit, a phase-locked loop circuit, or a delay-locked loop circuit. Analog test system 100 can test internal analog signals or output analog signals generated by circuits 111-113 or by other circuitry.

Control circuit 104 generates 6 or more digital enable signals E1, E2, E3, E4, E5, E6, etc. The enable signals E1, E2, E3, E4, E5, E6, etc. are collectively referred to as enable signals E1-EX in the Figures. Analog test system 100 can measure an analog signal generated by a circuit under test on the integrated circuit. Control circuit 104 asserts enable signal E1, E3, or E5 before analog test system 100 measures an analog signal generated by circuit 111, 112, or 113, respectively.

Analog test system 100 measures only one analog signal at a time, because conductor 115 only transmits one analog signal at a time. Thus, control circuit 104 asserts only one of enable signals E1, E3, or E5 at a time. In the embodiment of FIG. 1, analog test network 110 has only one single conductor 115 that is able to transmit a single-ended analog signal from a circuit under test to ADC 102 or from DAC 101 to a circuit under test.

Circuit 111 generates an analog signal AO1. Analog test system 100 can measure analog signal AO1 by asserting enable signal E1. Control circuit 104 asserts enable signal E1 to begin the measurement of analog signal AO1. Enable signal E1 is provided to a control input of pass gate circuit 121. When enable signal E1 is asserted, pass gate circuit 121 is in a conductive state, and analog signal AO1 is provided from circuit 111 through pass gate circuit 121 to conductor 115 as analog signal AO2. As an example, an enable signal can be asserted by changing its logic state to a predefined value. When control circuit 104 de-asserts enable signal E1, pass gate circuit 121 is in a non-conductive state, and analog signal AO1 is not provided to conductor 115.

Circuit 112 generates at least two different analog signals BO1 and BO2. Analog signals BO1 and BO2 are generated at two different nodes of circuit 112. Analog signals BO1 and BO2 are provided to two different multiplexing inputs of analog multiplexer circuit 123.

Analog test system 100 can measure one of the analog signals BO1 or BO2 generated by circuit 112 by asserting enable signal E3. Control circuit 104 asserts enable signal E3 to begin the measurement of an analog signal generated by circuit 112. Enable signal E3 is provided to a control input of analog multiplexer circuit 123. When enable signal E3 is asserted, analog multiplexer circuit 123 is enabled to provide one of analog signals BO1 or BO2 to conductor 115 as analog signal BO3. When enable signal E3 is de-asserted, analog multiplexer circuit 123 is disabled, and neither of analog signals BO1 or BO2 is provided to conductor 115.

Control circuit 104 also generates 4 or more digital select signals S1, S2, S3, S4, etc. Digital select signals S1, S2, S3, S4, etc. are referred to as select signals S1-SX in the Figures. Select signal S1 is provided to a select input of analog multiplexer circuit 123. The logic state of select signal S1 determines which of signals BO1 or BO2 analog multiplexer circuit 123 provides to conductor 115 when enable signal E3 is asserted. When select signal S1 is in a first logic state, and enable signal E3 is asserted, analog signal BO1 is provided from circuit 112 through analog multiplexer circuit 123 to conductor 115 as analog signal BO3. When select signal S1 is in a second logic state, and enable signal E3 is asserted, analog signal BO2 is provided from circuit 112 through analog multiplexer circuit 123 to conductor 115 as analog signal BO3.

Circuit 113 generates at least two different analog signals CO1 and CO2. Analog signals CO1 and CO2 are generated at two different nodes of circuit 113. Analog signals CO1 and CO2 are provided to two different multiplexing inputs of analog multiplexer circuit 125. According to various embodiments, circuit 113 generates 2, 3, 4, 5, 6, or more different analog signals at different nodes that are provided to different multiplexing inputs of analog multiplexer circuit 125.

Analog test system 100 can measure one of the analog signals CO1, CO2, etc. generated by circuit 113 by asserting enable signal E5. Control circuit 104 asserts enable signal E5 to begin the measurement of an analog signal generated by circuit 113. Enable signal E5 is provided to a control input of analog multiplexer circuit 125. When enable signal E5 is asserted, analog multiplexer circuit 125 is enabled to provide one of analog signals CO1, CO2, etc. to conductor 115 as analog signal CO3. When enable signal E5 is de-asserted, analog multiplexer circuit 125 is disabled, and none of the analog signals CO1, CO2, etc. generated by circuit 113 are provided to conductor 115.

Select signal S3 is provided to a select input of analog multiplexer circuit 125. The logic state of select signal S3 determines which of signals CO1 or CO2 analog multiplexer circuit 125 provides to conductor 115 when enable signal E5 is asserted. When select signal S3 is in a first logic state, and enable signal E5 is asserted, analog signal CO1 is provided from circuit 113 through analog multiplexer circuit 125 to conductor 115 as analog signal CO3. When select signal S3 is in a second logic state, and enable signal E5 is asserted, analog signal CO2 is provided from circuit 113 through analog multiplexer circuit 125 to conductor 115 as analog signal CO3.

ADC 102 converts the analog signal AO2, BO3, or CO3 on conductor 115 into one or more digital signals D1 in response to a clock signal CLK. The 1 or more digital signals D1 are provided through a digital test bus to storage circuit 103. The digital values of digital signals D1 on the digital test bus are stored in storage circuit 103. Storage circuit 103 stores the digital values of digital signals D1 in response to clock signal CLK. Storage circuit 103 uses clock signal CLK to distinguish between individual bits on the digital test bus. Storage circuit 103 may, for example, include registers, latches, random access memory, volatile memory, non-volatile memory, or other types of storage circuitry.

The digital values of digital signals D1 stored in storage circuit 103 are provided to control circuit 104 as one or more digital signals D2. Clock signal CLK is also provided to control circuit 104. Control circuit 104 uses clock signal CLK to distinguish between individual bits in the one or more digital signals D2. Control circuit 104 measures the digital values of digital signals D2. The digital values of digital signals D2 indicate the voltage of the analog signal AO2, BO3, or CO3 that ADC 102 measured from conductor 115. In some embodiments, the measured digital values of signals D2 are used for testing and/or debugging of the corresponding circuit under test 111, 112, or 113.

For example, control circuit 104 may measure the digital values of digital signals D2 to test a control voltage, a bias voltage, an impedance value, an analog waveform signal, etc. As a specific example, control circuit 104 may measure the digital values of digital signals D2 to test a control voltage provided to a voltage-controlled oscillator circuit or a current-controlled oscillator circuit. As another specific example, control circuit 104 may measure the digital values of digital signals D2 to test a supply voltage at an internal node of the integrated circuit.

In other embodiments, the measured digital values of digital signals D2 are used for calibration, adaptation, or other purposes. Control circuit 104 may be, for example, a programmable logic circuit block programmed as a control circuit. Alternatively, control circuit 104 may be a non-programmable control circuit such as a microprocessor. Control circuit 104 may, for example, function as a state machine.

In an embodiment, digital multiplexers 105 provide the digital values of digital signals D2 to pins 106 as digital signals D3. A device external to the integrated circuit can measure digital signals D3 for testing, debugging, calibration, adaptation, or other purposes, in addition to or instead of, the functions performed by control circuit 104.

Analog test system 100 can also set an internal node of a circuit under test on the integrated circuit to a predefined analog voltage. Control circuit 104 asserts enable signal E2, E4, or E6 before analog test system 100 sets the voltage of an internal node of circuit under test 111, 112, or 113, respectively, to a predefined analog voltage.

Control circuit 104 generates one or more digital signals D4 to set the internal node of a circuit under test on the integrated circuit to a predefined analog voltage. The digital values of digital signals D4 indicate the analog voltage to set the internal node of the circuit under test. Digital signals D4 are provided to inputs of storage circuit 103 through a digital bus. The digital values of digital signals D4 are stored in storage circuit 103. Storage circuit 103 stores the digital values of digital signals D4 in response to clock signal CLK. Storage circuit 103 uses clock signal CLK to distinguish between individual bits in digital signals D4.

In another embodiment, digital signals D6 are provided from an external test device to multiplexing inputs of multiplexer circuits 108 through pins 106. Multiplexer circuits 108 provide the digital values of digital signals D6 to storage circuit 103 as digital signals D4. The digital values of the output signals D4 of multiplexer circuits 108 are stored in storage circuit 103.

The digital values of digital signals D4 stored in storage circuit 103 are provided to digital-to-analog converter (DAC) circuit 101 as one or more digital signals D5. Digital signals D5 may be provided to circuit 101 through a digital bus. Clock signal CLK is also provided to DAC circuit 101. DAC circuit 101 converts digital signals D5 into an analog signal AI1, BI1, or CI1 on conductor 115 in response to clock signal CLK. DAC 101 uses clock signal CLK to distinguish between individual bits in digital signals D5. The analog signal that DAC circuit 101 generates based on digital signals D5 and provides to conductor 115 is referred to as analog signal AI1, BI1, or CI1 depending on which enable signal E2, E4, or E6, respectively, is asserted.

Analog test system 100 can set the voltage of an analog signal AI2 at a node of circuit 111 by asserting enable signal E2. Control circuit 104 asserts enable signal E2 to begin the process of setting the voltage of analog signal AI2. Enable signal E2 is provided to a control input of pass gate circuit 122. When enable signal E2 is asserted, pass gate circuit 122 is enabled in a conductive state to provide analog signal AI1 from conductor 115 to circuit 111 as analog signal AI2. When enable signal E2 is de-asserted, pass gate circuit 122 is in a non-conductive state.

Analog test system 100 can set the voltage of an analog signal BI2 or BI3 in circuit 112 by asserting enable signal E4. Control circuit 104 asserts enable signal E4 to begin the process of setting the voltage of analog signal BI2 or BI3. Enable signal E4 is provided to a control input of analog demultiplexer circuit 124. When enable signal E4 is asserted, analog demultiplexer circuit 124 is enabled to provide analog signal BI1 from conductor 115 to circuit 112 as analog signal BI2 or BI3. When enable signal E4 is de-asserted, analog demultiplexer circuit 124 is disabled.

Analog signals BI2 and BI3 are provided to two different nodes of circuit 112. Select signal S2 generated by control circuit 104 is provided to a select input of analog demultiplexer circuit 124. The logic state of select signal S2 determines which node of circuit 112 receives the analog signal BI1 on conductor 115 when enable signal E4 is asserted. When select signal S2 is in a first logic state, and enable signal E4 is asserted, analog demultiplexer circuit 124 provides analog signal BI1 from conductor 115 to a first node of circuit 112 as analog signal BI2. When select signal S2 is in a second logic state, and enable signal E4 is asserted, analog demultiplexer circuit 124 provides analog signal BI1 from conductor 115 to a second node of circuit 112 as analog signal BI3.

Analog test system 100 can set the voltage of an analog signal CI2, CI3, or another analog signal in circuit 113 by asserting enable signal E6. Control circuit 104 asserts enable signal E6 to begin the process of setting the voltage of an analog signal in circuit 113. Enable signal E6 is provided to a control input of analog demultiplexer circuit 126. According to various embodiments, analog demultiplexer circuit 126 has two or more outputs. When enable signal E6 is asserted, analog demultiplexer circuit 126 is enabled to provide analog signal CI1 from conductor 115 to a node of circuit 113 as analog signal CI2, CI3, or as another analog signal. Each of the analog signals CI2, CI3, etc. generated at an output of analog demultiplexer circuit 126 is provided to a different node of circuit 113. When enable signal E6 is de-asserted, analog demultiplexer circuit 126 is disabled.

Select signal S4 generated by control circuit 104 is provided to a select input of analog demultiplexer circuit 126. The logic state of select signal S4 determines which node of circuit 113 receives the analog signal CI1 on conductor 115 when enable signal E6 is asserted. When select signal S4 is in a first logic state, and enable signal E6 is asserted, analog demultiplexer circuit 126 provides analog signal CI1 from conductor 115 to a first node of circuit 113 as analog signal CI2. When select signal S4 is in a second logic state, and enable signal E6 is asserted, analog demultiplexer circuit 126 provides analog signal CI1 from conductor 115 to a second node of circuit 113 as analog signal CI3. If analog demultiplexer circuit 126 has 3 or more outputs, then 2 or more select signals generated by control circuit 104 are provided to select inputs of analog demultiplexer circuit 126.

Analog test system 100 can set the voltage of an analog signal AI2, BI2/BI3, or CI2/CI3 by asserting one of enable signals E2, E4, or E6, respectively, and de-asserting the other two enable signals E2, E4, and E6. Analog test system 100 can set the voltage of two or more analog signals at the same time by asserting two or more of enable signals E2, E4, and E6. When two or more of enable signals E2, E4, and E6 are asserted at the same time, a corresponding set of two or more of analog signals AI2, BI2 or BI3, and CI2 or CI3 are set to the voltage on conductor 115.

Control circuit 104 can also control analog voltages in circuits 111, 112 and 113 by generating analog feedback voltages F1, F2, and F3, respectively. Analog feedback voltages F1, F2, and F3 are generated by control circuit 104. Analog feedback voltages F1, F2, and F3 are provided from control circuit 104 directly to inputs of circuits 111, 112, and 113 through conductors 141, 142, and 143, respectively. Each of the analog feedback voltages F1, F2, and F3 is provided through a separate one of the conductors 141, 142, and 143, respectively.

In other embodiments, analog test system 100 measures one or more analog signals from one or more of circuits 111-113 for calibration or adaptation. Control circuit 104 can determine if one or more of the measured analog signals AO2, BO3, or CO3 equals a desired voltage. If control circuit 104 determines that the measured analog signal does not equal the desired voltage, analog test system 100 sets an internal node of the measured circuit 111, 112, or 113 to a predefined voltage in order to calibrate or adapt the measured circuit. Control circuit 104 sets the voltage of an internal node of a circuit by selecting the digital values of digital signals D4 to set the voltage on conductor 115, as described above. Alternatively, control circuit 104 sets the voltage of an internal node of a circuit by generating one of the analog feedback signals F1-F3.

For example, if circuit 111 is a phase-locked loop (PLL) circuit having a voltage-controlled oscillator (VCO) circuit, analog test system 100 can test PLL circuit 111 by sweeping the control voltage of the VCO circuit through its tuning range. In one embodiment, control circuit 104 generates multiple sets of digital values for digital signals D4 that cause DAC 101 to generate multiple different analog voltages on conductor 115. Each of these analog voltages AI1 is generated on conductor 115 at a different time. Each analog voltage AI1 on conductor 115 is provided to the control input of the VCO circuit in PLL circuit 111 through pass gate 122 as signal AI2.

In this example, signal AI2 sets the control voltage that controls the frequencies of the output clock signals of the VCO circuit in PLL circuit 111. The output clock signals of the VCO are provided through a digital bus 130 to control circuit 104 as shown in FIG. 1. Control circuit 104 measures the frequencies of the output clock signals of the VCO on digital bus 130 for different control voltages of the VCO. In another embodiment, control circuit 104 generates multiple analog voltages in feedback signal F1 at different times, and feedback signal F1 is provided to the control input of the VCO circuit in PLL circuit 111 to sweep the frequencies of the output clock signals.

As another example, circuit 112 may be an on-chip termination circuit that provides termination resistances to pins. The pins are external terminals of the integrated circuit. In this example, analog test system 100 calibrates the termination resistances that the on-chip termination circuit provides to the pins by forcing a fixed current with a known value through the termination resistances. In this example, signals BO1 and BO2 are voltages generated at two different pins. Analog multiplexer circuit 123 provides a voltage BO1 or BO2 generated at one of these two pins to conductor 115 as signal BO3. ADC 102 converts analog voltage signal BO3 to digital signals D1, storage circuit 103 provides the digital values of digital signals D1 as digital signals D2, and control circuit 104 measures the digital values of digital signals D2, as described above.

If control circuit 104 determines that the measured digital values of digital signals D2 indicate a voltage at the pin that does not correspond to a desired termination resistance, control circuit 104 generates digital values for digital signals D4 to adjust the termination resistance in circuit 112. DAC 101 generates an analog voltage BI1 on conductor 115 that equals the analog voltage indicated by digital signals D4 and D5. Analog demultiplexer circuit 124 provides analog voltage BI1 to one or both of two nodes that control the termination resistances at the two pins. The analog voltages at these two nodes are BI2 and BI3. Circuit 112 adjusts the termination resistance based on the received analog voltage BI2 or BI3. In another embodiment, control circuit 104 generates a voltage in feedback signal F2 that is used by circuit 112 to adjust the termination resistance to a desired value.

As another example, circuit 113 generates analog voltages CO1 and CO2 that change in response to changes in the temperature of the integrated circuit. In this example, analog test system 100 adapts analog voltages CO1 and CO2 to compensate for changes in the temperature of the integrated circuit. Analog multiplexer circuit 125 provides analog voltage CO1 or CO2 from circuit 113 to conductor 115 as signal CO3. ADC 102 converts voltage signal CO3 to digital signals D1, storage circuit 103 provides the digital values of digital signals D1 as digital signals D2, and control circuit 104 measures the digital values of digital signals D2, as described above.

If control circuit 104 determines that the measured digital values of digital signals D2 indicate that the analog voltage CO3 has deviated from a desired value, control circuit 104 generates digital values for digital signals D4 to adjust the measured analog voltage. DAC 101 generates an analog voltage CI1 on conductor 115 that equals the analog voltage indicated by the digital value of digital signals D4 and D5. Analog demultiplexer circuit 126 provides analog voltage CI1 to a control node in circuit 113 that controls the measured voltage CO1 or CO2.

If voltage CO1 was measured by system 100, analog demultiplexer circuit 126 provides the analog voltage CI1 on conductor 115 to a first control node in circuit 113 as analog voltage CI2. If voltage CO2 was measured by system 100, analog demultiplexer circuit 126 provides the analog voltage CI1 on conductor 115 to a second control node in circuit 113 as analog voltage CI3. Circuit 113 then adjusts analog voltage CO1 or CO2 based on the analog voltage CI2 or CI3 received at the respective control node. In another embodiment, control circuit 104 generates a voltage in feedback signal F3 that is used by circuit 113 to adjust voltage CO1 or CO2 to a desired voltage to adapt to changes in the temperature of the integrated circuit.

According to another embodiment, conductor 115 is coupled to two or more ADC circuits and to two or more DAC circuits. Each pair of ADC and DAC circuits communicates with a different storage circuit and with a different control circuit or a different set of pins.

Figure 2:
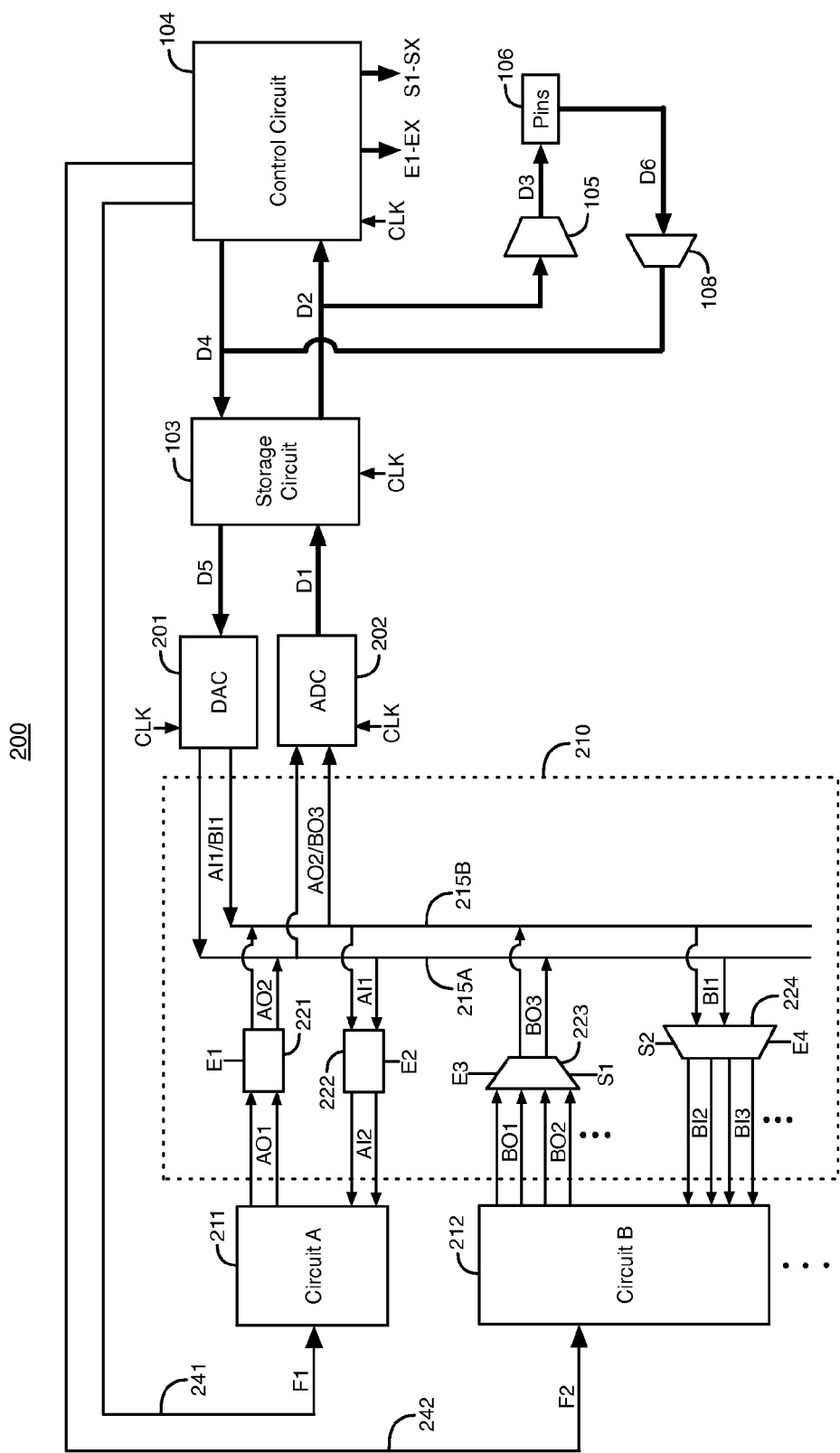
FIG. 2 illustrates an example of an analog test system on an integrated circuit, according to another embodiment of the present invention.

FIG. 2 illustrates an example of an analog test system 200 on an integrated circuit, according to another embodiment of the present invention. Analog test system 200 includes digital-to-analog converter (DAC) circuit 201, analog-to-digital converter (ADC) circuit 202, storage circuit 103, control circuit 104, digital multiplexer circuits 105 and 108, pins 106, differential analog test network 210, circuits under test 211-212, and conductors 241-242. Differential analog test network 210 includes differential conductors 215A and 215B, differential pass gate circuits 221-222, differential analog multiplexer circuit 223, and differential analog demultiplexer circuit 224. Analog test system 200 may be in any type of integrated circuit die.

Analog test system 200 can test differential analog signals generated by circuit A 211, circuit B 212, or other circuits in the integrated circuit. Analog test system 200 can provide a differential analog signal from one of circuits 211, 212, or another circuit to differential analog test network 210 for measurement, testing, debugging, adaption, calibration, or other purposes.

In the embodiment of FIG. 2, analog test network 210 has two conductors 215A and 215B that are able to transmit a differential analog signal from a circuit under test to ADC 202 or from DAC 201 to a circuit under test. Analog test system 200 measures only one differential analog signal at a time, because conductors 215A and 215B only transmit one differential analog signal at a time.

Analog test system 200 begins the measurement of a differential analog signal AO1 generated by circuit 211 when control circuit 104 asserts enable signal E1. Enable signal E1 is provided to a control input of pass gate circuit 221. When enable signal E1 is asserted, pass gate circuit 221 is in a conductive state, and differential analog signal AO1 is provided from circuit 211 through pass gate circuit 221 to conductors 215A and 215B as differential analog signal AO2. When control circuit 104 de-asserts enable signal E1, pass gate circuit 221 is in a non-conductive state, and differential analog signal AO1 is not provided to conductors 215A and 215B.

Circuit 212 generates at least two differential analog signals BO1 and BO2 at four different nodes of circuit 212. Differential analog signals BO1 and BO2 are provided to four different multiplexing inputs of differential analog multiplexer circuit 223. According to various embodiments, circuit 212 generates 2, 3, 4, 5, 6, or more differential analog signals BO1, BO2, etc. that are provided to different multiplexing inputs of differential analog multiplexer circuit 223.

Analog test system 200 begins the measurement of one of the differential analog signals BO1, BO2, etc. generated by circuit 212 when control circuit 104 asserts enable signal E3. Enable signal E3 is provided to a control input of differential analog multiplexer circuit 223. When enable signal E3 is asserted, differential analog multiplexer circuit 223 is enabled to provide one of differential analog signals BO1, BO2, etc. to conductors 215A and 215B as differential analog signal BO3. When enable signal E3 is de-asserted, differential analog multiplexer circuit 223 is disabled, and none of the analog signals BO1, BO2, etc. generated by circuit 212 are provided to conductors 215A and 215B.

Select signal S1 generated by control circuit 104 is provided to a select input of differential analog multiplexer circuit 223. When select signal S1 is in a first logic state, and enable signal E3 is asserted, differential analog signal BO1 is provided from circuit 212 through differential analog multiplexer circuit 223 to conductors 215A-215B as differential analog signal BO3. When select signal S1 is in a second logic state, and enable signal E3 is asserted, differential analog signal BO2 is provided from circuit 212 through differential analog multiplexer circuit 223 to conductors 215A-215B as differential analog signal BO3.

ADC 202 converts the differential analog signal AO2 or BO3 on conductors 215A-215B into one or more digital signals D1 in response to a clock signal CLK. The one or more digital signals D1 are provided through a digital test bus to storage circuit 103. The digital values of digital signals D1 on the digital test bus are stored in storage circuit 103 in response to clock signal CLK. The digital values of digital signals D1 stored in storage circuit 103 are provided to control circuit 104 as digital signals D2, as described with respect to FIG. 1.

Analog test system 200 can also set an internal node of a circuit under test on the integrated circuit to a predefined analog voltage. Control circuit 104 generates one or more digital signals D4 to set the voltage of an internal node of a circuit under test, as described with respect to FIG. 1. The digital values of digital signals D4 stored in storage circuit 103 are provided to DAC circuit 201 in digital signals D5. DAC circuit 201 converts digital signals D5 into a differential analog signal AI1 or BI1 on conductors 215A-215B in response to clock signal CLK.

Analog test system 200 can set the voltage of a differential analog signal AI2 in circuit 211 by asserting enable signal E2. Control circuit 104 asserts enable signal E2 to begin the process of setting the voltage of differential analog signal AI2. Enable signal E2 is provided to a control input of pass gate circuit 222. When enable signal E2 is asserted, pass gate circuit 222 is enabled in a conductive state to provide differential analog signal AI1 from conductors 215A-215B to circuit 211 as analog signal AI2.

Analog test system 200 can set the voltage of a differential analog signal BI2, B13, or another differential analog signal in circuit 212 by asserting enable signal E4. Control circuit 104 asserts enable signal E4 to begin the process of setting the voltage of a differential analog signal in circuit 212. Enable signal E4 is provided to a control input of analog demultiplexer circuit 224. According to various embodiments, differential analog demultiplexer circuit 224 has four or more outputs. When enable signal E4 is asserted, differential analog demultiplexer circuit 224 is enabled to provide differential analog signal BI1 from conductors 215A-215B to circuit 212 as differential analog signal BI2, BI3, or as another differential analog signal. Each of the differential analog signals BI2, BI3, etc. generated at a pair of outputs of differential analog demultiplexer circuit 224 is provided to a different pair of nodes of circuit 212.

Select signal S2 generated by control circuit 104 is provided to a select input of differential analog demultiplexer circuit 224. When select signal S2 is in a first logic state, and enable signal E4 is asserted, differential analog demultiplexer circuit 224 provides differential analog signal BI1 from conductors 215A-215B to circuit 212 as differential analog signal BI2. When select signal S2 is in a second logic state, and enable signal E4 is asserted, differential analog demultiplexer circuit 224 provides differential analog signal BI1 from conductors 215A-215B to circuit 212 as differential analog signal BI3. If differential analog demultiplexer circuit 224 has 6 or more outputs, 2 or more select signals generated by control circuit 104 are provided to select inputs of differential analog demultiplexer circuit 224.

In analog test system 200, control circuit 104 can also control analog voltages in circuits 211 and 212 by generating analog feedback voltages F1 and F2, respectively. Analog feedback voltages F1 and F2 are generated by control circuit 104 and provided from control circuit 104 directly to inputs of circuits 211 and 212 through conductors 241-242, respectively. Control circuit 104 may also generate other analog feedback voltages that are provided to inputs of one or more other circuits under test on the integrated circuit.

Figure 3:
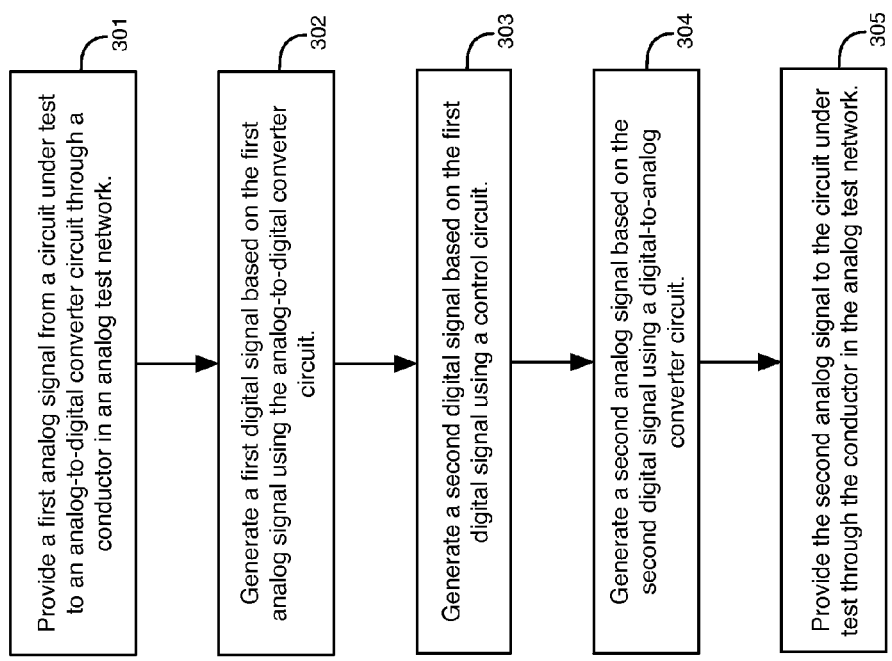
FIG. 3 is a flow chart illustrating examples of operations that can be performed by the analog test systems of FIG. 1 and FIG. 2, according to an embodiment of the present invention.

FIG. 3 is a flow chart that illustrates examples of operations that can be performed by analog test system 100 and analog test system 200, according to an embodiment of the present invention. Analog test system 100 or 200 may, for example, use the operations shown in FIG. 3 to calibrate a circuit under test. As another example, analog test system 100 or 200 may use the operations of FIG. 3 to adapt an analog voltage in a circuit under test based on changes in the analog voltage that are caused by variations in the temperature, the process, or a supply voltage of the integrated circuit.

In operation 301, a first analog signal is provided from a circuit under test to an analog-to-digital converter circuit through a conductor in an analog test network. The circuit under test may be, for example, one of circuits 111-113 in FIG. 1 or one of circuits 211-212 in FIG. 2. The analog-to-digital converter circuit may be, for example, ADC 102 in FIG. 1 or ADC 202 in FIG. 2. The analog test network may be, for example, analog test network 110 in FIG. 1 or analog test network 210 in FIG. 2. The conductor may be, for example, conductor 115 in FIG. 1, conductor 215A in FIG. 2, or conductor 215B in FIG. 2.

In operation 302, the analog-to-digital converter circuit generates a first digital signal based on the first analog signal. In operation 303, a control circuit, such as control circuit 104, generates a second digital signal based on the first digital signal. In operation 304, a digital-to-analog converter circuit generates a second analog signal based on the second digital signal. The digital-to-analog converter circuit may be, for example, DAC 101 in FIG. 1 or DAC 201 in FIG. 2. In operation 305, the second analog signal is provided to the circuit under test through the conductor in the analog test network.

Figure 4:
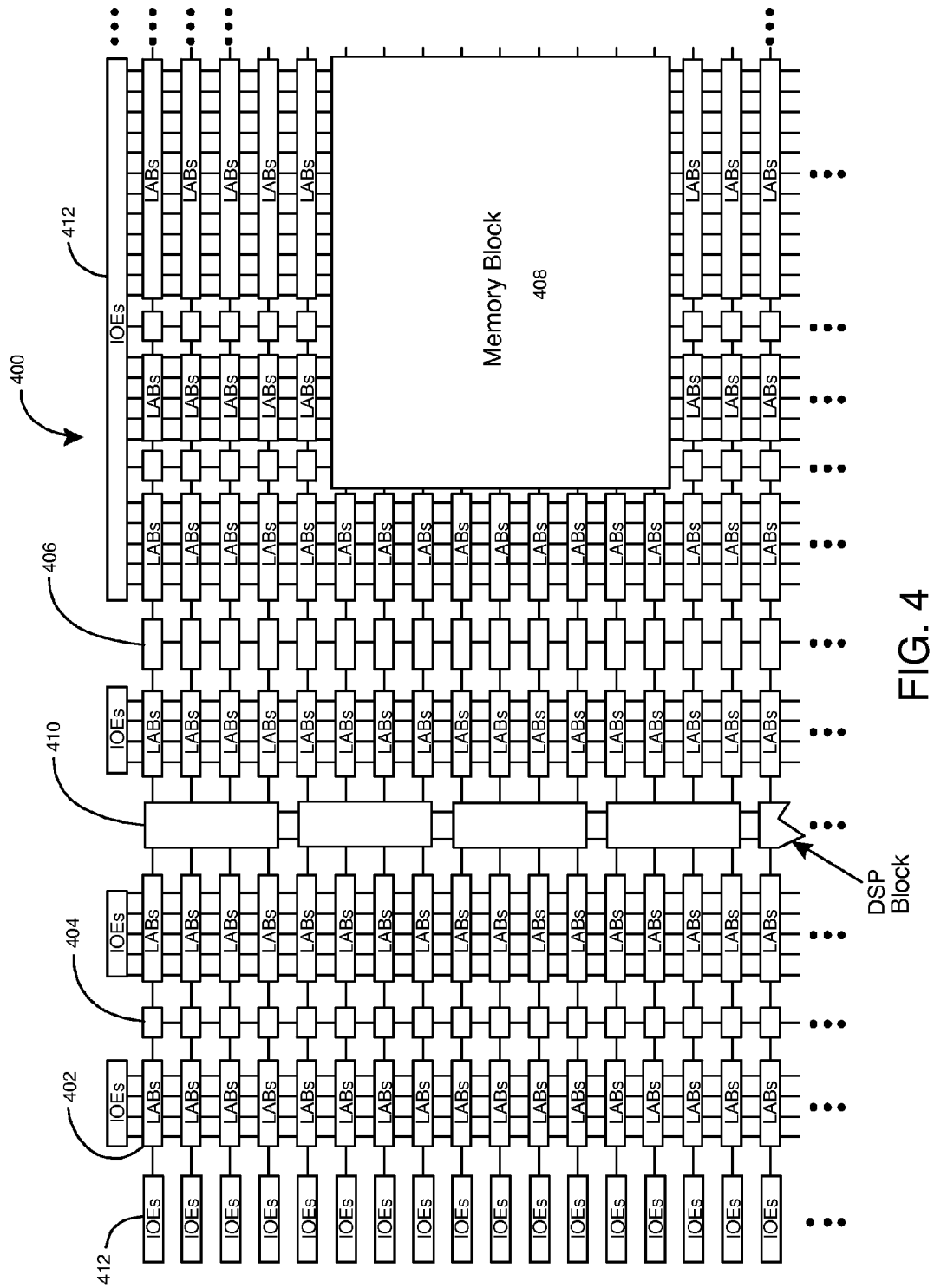
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 400 includes a two-dimensional array of programmable logic array blocks (or LABs) 402 that are interconnected by a network of column and row interconnect conductors of varying length and speed. LABs 402 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 support numerous single-ended and differential input/output standards. IOEs 412 include input and output buffers that are coupled to pins of the integrated circuit. The pins are external terminals of the FPGA die that can be used to route, for example, input signals, output signals, and supply voltages between the FPGA and one or more external devices. FPGA 400 is described herein for illustrative purposes. Embodiments of the present invention can be implemented in many different types of integrated circuits.

Figure 5:
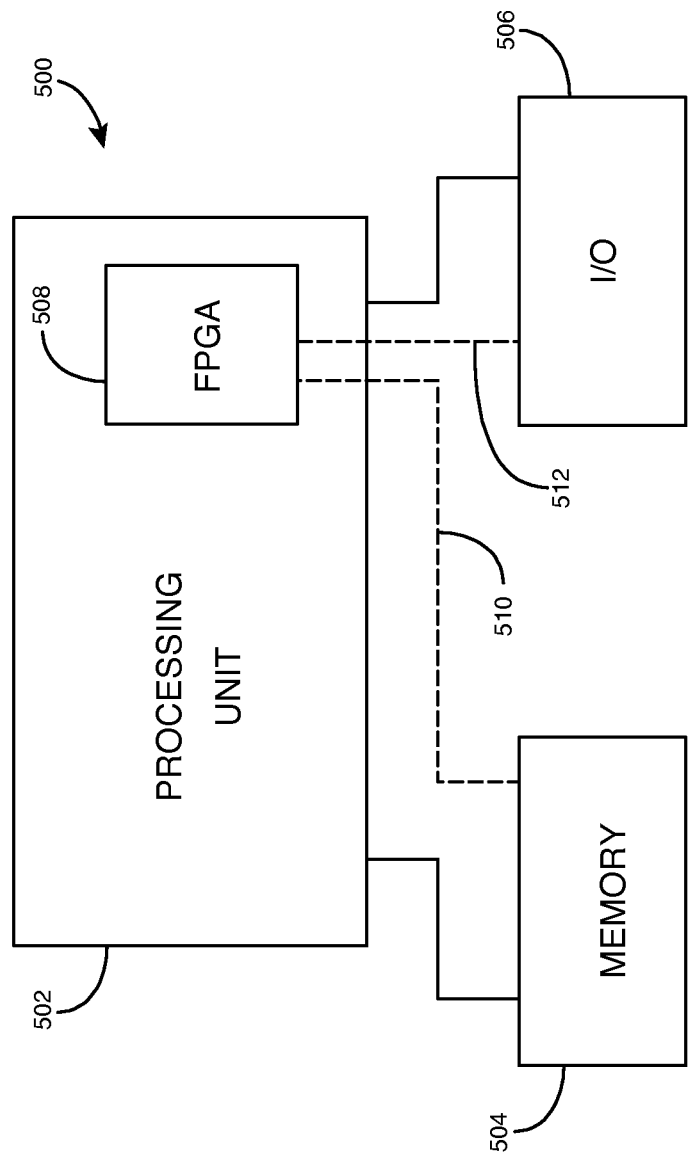
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor that can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a first circuit under test;
   an analog test network comprising a first conductor and a first multiplexer circuit;
   an analog-to-digital converter circuit, wherein the first multiplexer circuit is enabled in response to a first enable signal being asserted to provide a first analog signal from a node of the first circuit under test that is selected based on a first select signal through the first conductor to the analog-to-digital converter circuit, wherein the analog-to-digital converter circuit generates a first digital signal based on the first analog signal, and wherein the first multiplexer circuit is disabled from providing the first analog signal from the first circuit under test through the first conductor to the analog-to-digital converter circuit in response to the first enable signal being de-asserted;
   a control circuit to generate a second digital signal based on the first digital signal; and
   a digital-to-analog converter circuit to generate a second analog signal based on the second digital signal, wherein the first conductor is coupled to provide the second analog signal from the digital-to-analog converter circuit to the first circuit under test.

2. The circuit of claim 1 further comprising:
   a storage circuit to store values of the first digital signal and to provide the values of the first digital signal to the control circuit as a third digital signal, wherein the storage circuit stores values of the second digital signal and provides the values of the second digital signal to the digital-to-analog converter circuit as a fourth digital signal.

3. The circuit of claim 1, wherein the control circuit generates a third analog signal based on the first digital signal, and wherein the third analog signal is provided through a second conductor directly to an input of the first circuit under test.

4. The circuit of claim 1, wherein the analog test network further comprises:
   a demultiplexer circuit that is enabled in response to a second enable signal being asserted to provide the second analog signal from the first conductor to a node of the first circuit under test that is selected based on a second select signal, and wherein the demultiplexer circuit is disabled from providing the second analog signal to the first circuit under test from the first conductor in response to the second enable signal being de-asserted.

5. The circuit of claim 1, wherein the analog test network further comprises:
   a demultiplexer circuit that is enabled by a second enable signal to provide the second analog signal from the first conductor in the analog test network to a node of the first circuit under test that is selected based on a second select signal.

6. The circuit of claim 1 further comprising:
a digital bus coupled to outputs of the first circuit under test and to inputs of the control circuit.

7. The circuit of claim 1 further comprising:
a second circuit under test; and
a second multiplexer circuit coupled to the first conductor and coupled to the second circuit under test, wherein the second multiplexer circuit is enabled by a second enable signal to provide a third analog signal from a node of the second circuit under test that is selected based on a second select signal through the first conductor to the analog-to-digital converter circuit.

8. The circuit of claim 7, wherein the analog-to-digital converter circuit generates a third digital signal based on the third analog signal, wherein the control circuit generates a fourth digital signal based on the third digital signal, wherein the digital-to-analog converter circuit generates a fourth analog signal based on the fourth digital signal,
and wherein the analog test network further comprises a demultiplexer circuit that is enabled by a third enable signal to provide the fourth analog signal to a node of the second circuit under test that is selected based on a third select signal.

9. The circuit of claim 1, wherein the first circuit under test, the analog test network, the analog-to-digital converter circuit, the control circuit, and the digital-to-analog converter circuit are all in a single integrated circuit.

10. A circuit comprising:
a first circuit under test;
an analog test network comprising a first multiplexer circuit;
an analog-to-digital converter circuit, wherein the analog test network provides a first analog signal from a node of the first circuit under test to the analog-to-digital converter circuit when the first multiplexer circuit is enabled in response to a first enable signal being asserted, wherein the first multiplexer circuit selects the node of the first circuit under test from at least two nodes based on a first select signal, wherein the analog-to-digital converter circuit generates a first digital signal based on the first analog signal, and wherein the first multiplexer circuit is disabled from providing the first analog signal from the first circuit under test to the analog-to-digital converter circuit in response to the first enable signal being de-asserted;
a control circuit to generate a second analog signal based on the first digital signal; and
a first conductor coupled to provide the second analog signal from an output of the control circuit directly to an input of the first circuit under test bypassing the analog test network.

11. The circuit of claim 10 further comprising:
a second circuit under test, wherein the analog test network further comprises a second multiplexer circuit, wherein the analog test network provides a third analog signal from a node of the second circuit under test to the analog-to-digital converter circuit when the second multiplexer circuit is enabled by a second enable signal, wherein the second multiplexer circuit selects the node of the second circuit under test from at least two nodes based on a second select signal, wherein the analog-to-digital converter circuit generates a second digital signal based on the third analog signal, and wherein the control circuit generates a fourth analog signal based on the second digital signal; and
a second conductor coupled to provide the fourth analog signal from an output of the control circuit directly to an input of the second circuit under test.

12. The circuit of claim 10 further comprising:
a digital-to-analog converter circuit,
wherein the control circuit generates a second digital signal based on the first digital signal, wherein the digital-to-analog converter circuit generates a third analog signal based on the second digital signal, and wherein the analog test network provides the third analog signal to the first circuit under test.

13. The circuit of claim 12 further comprising:
a storage circuit to store values of the first digital signal and to provide the values of the first digital signal to the control circuit as a third digital signal, wherein the storage circuit stores values of the second digital signal and provides the values of the second digital signal to the digital-to-analog converter circuit as a fourth digital signal.

14. The circuit of claim 13 further comprising:
a second multiplexer circuit to provide values of the third digital signal to a pin; and
a third multiplexer circuit to provide values of a fifth digital signal from a pin to the storage circuit.

15. The circuit of claim 13, wherein the first circuit under test, the analog test network, the analog-to-digital converter circuit, the control circuit, the first conductor, the storage circuit, and the digital-to-analog converter circuit are all in a single integrated circuit.

16. The circuit of claim 10, wherein the first circuit under test is selected from the group of circuits consisting of a phase-locked loop circuit, a delay-locked loop circuit, and an on-chip termination impedance circuit.

17. A method comprising:
providing a first analog signal from a first circuit under test to an analog-to-digital converter circuit through a first conductor in an analog test network;
generating a first digital signal based on the first analog signal using the analog-to-digital converter circuit;
generating a second digital signal based on the first digital signal using a control circuit;
generating a second analog signal based on the second digital signal using a digital-to-analog converter circuit;
providing the second analog signal from the first conductor in the analog test network to a first selected node of the first circuit under test using a first demultiplexer circuit that is enabled in response to a first enable signal being asserted, wherein the first demultiplexer circuit selects the first selected node of the first circuit under test from at least two nodes based on a first select signal; and
disabling the first demultiplexer circuit from providing the second analog signal to the first circuit under test from the first conductor in response to the first enable signal being de-asserted.

18. The method of claim 17 further comprising:
generating a third analog signal based on the first digital signal using the control circuit; and
providing the third analog signal through a second conductor directly to an input of the first circuit under test.

19. The method of claim 17 wherein providing a first analog signal from a first circuit under test to an analog-to-digital converter circuit through a first conductor in an analog test network comprises:

enabling a multiplexer circuit using a second enable signal to provide the first analog signal from a second selected node of the first circuit under test through the first conductor to the analog-to-digital converter circuit, wherein the multiplexer circuit selects the second selected node of the first circuit under test from at least two nodes based on a second select signal.

20. The method of claim 17 further comprising:

providing a third analog signal from the first conductor in the analog test network to a selected node of a second circuit under test using a second demultiplexer circuit that is enabled by a second enable signal, wherein the second demultiplexer circuit selects the selected node of the second circuit under test from at least two nodes based on a second select signal.

* * * * *